(12) United States Patent
Nishimura

(10) Patent No.: US 8,124,536 B2
(45) Date of Patent: Feb. 28, 2012

(54) MANUFACTURING METHOD OF CAPACITOR ELECTRODE, MANUFACTURING SYSTEM OF CAPACITOR ELECTRODE, AND STORAGE MEDIUM

(75) Inventor: Eiichi Nishimura, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 881 days.

(21) Appl. No.: 11/946,289

(22) Filed: Nov. 28, 2007

(65) Prior Publication Data

US 2008/0124936 A1 May 29, 2008

Related U.S. Application Data

(60) Provisional application No. 60/883,289, filed on Jan. 3, 2007.

(30) Foreign Application Priority Data

Nov. 29, 2006 (JP) .................................. 2006-321680

(51) Int. Cl.
*H01L 21/302* (2006.01)
*H01L 21/461* (2006.01)
(52) U.S. Cl. ......... 438/706; 438/714; 438/723; 438/734
(58) Field of Classification Search .................. None
See application file for complete search history.

(56) References Cited

U.S. PATENT DOCUMENTS

| 5,980,770 A * | 11/1999 | Ramachandran et al. ...... 216/67 |
| 7,435,644 B2 | 10/2008 | Shim et al. |
| 2005/0150861 A1 | 7/2005 | Lee et al. |
| 2006/0211163 A1 * | 9/2006 | Ouellet et al. .................. 438/50 |

FOREIGN PATENT DOCUMENTS

| EP | 1 237 177 A2 | 9/2002 |
| JP | 2005-203407 A | 7/2005 |
| KR | 1020060088733 A | 8/2006 |
| WO | WO 2004/084280 A2 | 9/2004 |

OTHER PUBLICATIONS

European Search Report mailed on Jul. 1, 2011. issued in corresponding European Application No. EP 07 02 3122.

* cited by examiner

*Primary Examiner* — Duy Deo
(74) *Attorney, Agent, or Firm* — Oblon, Spivak, McClelland, Maier & Neustadt, L.L.P.

(57) ABSTRACT

A method for manufacturing a capacitor electrode by removing a silicon oxide film on a surface of a substrate, including: transforming the silicon oxide film into a reaction product by supplying a gas containing a halogen element to chemically react with the silicon oxide film while controlling temperature of the substrate to a first process temperature; and removing the silicon oxide film transformed to the reaction product while controlling the temperature of the substrate to a second process temperature higher than the first process temperature. The silicon oxide film is a BPSG film.

8 Claims, 6 Drawing Sheets

MANUFACTURING METHOD OF CAPACITOR ELECTRODE, MANUFACTURING SYSTEM OF CAPACITOR ELECTRODE, AND STORAGE MEDIUM

FIELD OF THE INVENTION

The present invention relates to a method and a system for manufacturing a capacitor electrode by removing an oxide film on a surface of a substrate in a manufacturing process of a semiconductor device, and a storage medium for performing the method for manufacturing the capacitor electrode.

BACKGROUND OF THE INVENTION

Along with a recent trend for high integration of a semiconductor device, a dimension of a pattern has been remarkably scaled down. For example, in case a DRAM (dynamic random access memory) is manufactured, a capacitor electrode of a cylindrical shape is required to be thinner, and it is required to be longer to increase capacitance.

In order to manufacture a cylindrical capacitor electrode, a storage node hole is first formed in a pattern on a silicon oxide film, e.g., a BPSG film or the like, which is previously formed on a surface of a substrate. Then, a conductive material such as TiN, polysilicon or the like is deposited on an inner surface of the storage node hole, thus forming the cylindrical capacitor electrode. Next, the silicon oxide film remaining around the capacitor electrodes is removed by etching. In this case, a wet etching using an etching solution such as a BOE (buffered oxide etchant), a DHF (diluted hydro fluoricacid) or the like is widely used to etch the silicon oxide film remaining around the capacitor electrode.

However, when the thin and long capacitor electrode is manufactured, the wet etching method causes the capacitor electrode to be inclined (so-called "leaning"). In other words, in the wet etching method, tensile force is generated between capacitor electrodes due to surface tension of the etching solution and, thus, the capacitor electrodes pull each other. As a result, the recent thin and long capacitor electrode can fall down.

To that end, there has been employed a method for providing a support film made of SiN or the like between the capacitor electrodes. In addition, an etching solution containing anionic surfactant is being developed to selectively remove the silicon oxide film remaining around the capacitor electrode while protecting the support film made of SiN or the like.

However, the method for forming a support film to prevent the leaning requires a film forming process for forming a SiN film or the like, which is not cost-effective. Further, in the case of the conventional wet etching method, it is difficult to selectively etch the silicon oxide film, so that the SiN film serving as the support film may be damaged by the etching.

SUMMARY OF THE INVENTION

It is an object of the present invention, therefore, to prevent a leaning of a capacitor electrode in manufacturing the capacitor electrode by removing a silicon oxide film on a surface of a substrate.

In accordance with one aspect of the invention, there is provided a method for manufacturing a capacitor electrode by removing a silicon oxide film on a surface of a substrate, including: transforming the silicon oxide film into a reaction product by supplying a gas containing a halogen element to chemically react with the silicon oxide film while controlling temperature of the substrate to a first process temperature; and removing the silicon oxide film transformed to the reaction product while controlling the temperature of the substrate to a second process temperature higher than the first process temperature. The first processing temperature is lower than or equal to, e.g., about 40° C. The second processing temperature is, e.g., about 100° C. to about 400° C.

It is preferable that the silicon oxide film is a BPSG film. The capacitor electrode may have a cylindrical shape.

The gas containing a halogen element may be a gas containing HF. Preferably, transforming the silicon oxide film to the reaction product is performed under a depressurized atmosphere. In this case, the step of transforming the silicon oxide film to the reaction product is performed at, e.g., about 400 Pa to about 4000 Pa.

Further, removing the reaction product by heating is performed under the depressurized atmosphere. In this case, the step of removing the reaction product by heating is performed at, e.g., about 133 Pa to about 400 Pa.

In removing the reaction product by heating, an alkaline gas may be supplied. The alkaline gas may be ammonia gas.

In accordance with another aspect of the invention, there is provided a system for manufacturing a capacitor electrode by removing a silicon oxide film on a surface of a substrate, including: a reaction apparatus for transforming the silicon oxide film on the surface of the substrate to a reaction product; and a heat treatment apparatus for performing a heat treatment on the silicon oxide film transformed to the reaction product, wherein the reaction apparatus includes: a reaction chamber for accommodating therein the substrate; a mounting table for mounting thereon the substrate in the reaction chamber and controlling the temperature of the substrate to a required temperature; and a gas supply source for supplying a gas containing a halogen element into the reaction chamber, and the heat treatment apparatus has: a heat treatment chamber for accommodating therein the substrate; and a mounting table for mounting thereon the substrate in the heat treatment chamber and controlling the temperature of the substrate to a required temperature.

The system for manufacturing a capacitor electrode further includes an inert gas supply source for supplying an inert gas to the reaction chamber and a depressurization mechanism for depressurizing an inner space of the reaction chamber to a required pressure level.

It is preferable that the heat treatment apparatus further has a gas supply source for supplying an alkaline gas to the heat treatment chamber.

The system for manufacturing a capacitor electrode further includes an inert gas supply source for supplying an inert gas into the heat treatment chamber and a depressurization mechanism for depressurizing an inner space of the heat treatment chamber to a required pressure level.

In accordance with still another aspect of the invention, there is provided a storage medium for storing a program executable by a control computer of a manufacturing system, wherein the program is executed by the control computer to thereby control the manufacturing system to perform the method for manufacturing a capacitor electrode.

In the present invention, the silicon oxide film such as a BPSG film or the like on the surface of the substrate is transformed into the reaction product by the chemical reaction with gas containing a halogen element, e.g., HF or the like. In this case, the silicon oxide film is transformed into the reaction product containing, e.g., $H_2SiF_6$.

Thereafter, by performing a PHT (post heat treatment) on the reaction product thus generated, the reaction product is removed, as $SiF_4$ gas and HF gas, from the substrate. In other words, the PHT performed here is a treatment for vaporizing (sublimating or evaporating) the reaction product to $SiF_4$ gas and HF gas.

In accordance with the present invention, it is possible to selectively remove the silicon oxide film, e.g., a BPSG film or the like on the surface of the substrate. Moreover, in accordance with the present invention, the leaning can be avoided when removing the silicon oxide film remaining around the cylindrical capacitor electrode formed in the storage node hole of the silicon oxide film.

BRIEF DESCRIPTION OF THE DRAWINGS

The above and other objects and features of the present invention will become apparent from the following description of embodiments, given in conjunction with the accompanying drawings, in which.

DETAILED DESCRIPTION OF THE EMBODIMENT

Figure 1:
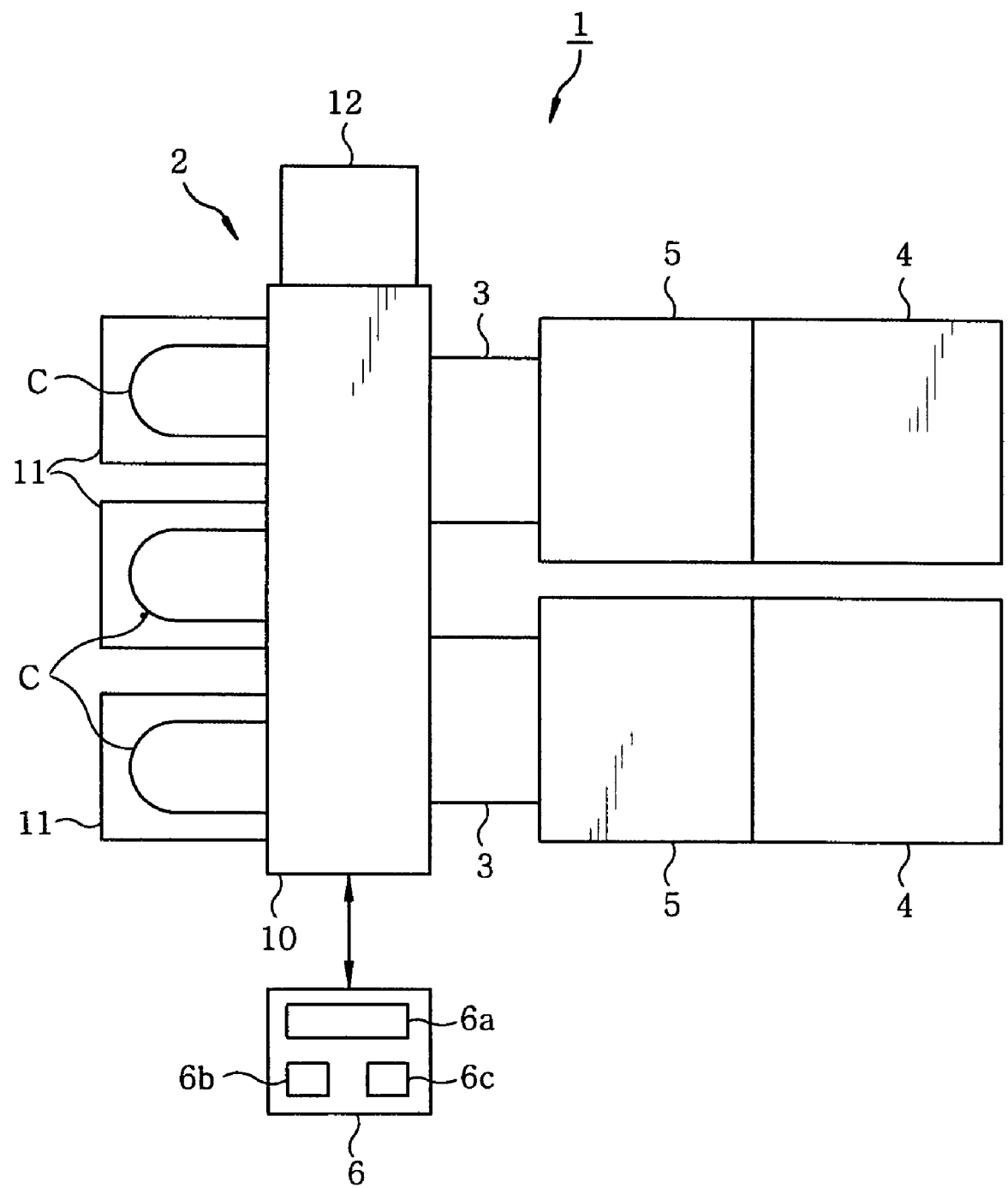
FIG. 1 illustrates a schematic top view of a manufacturing system in accordance with an embodiment of the present invention.

Hereinafter, embodiments of the present invention will be described with reference to the accompanying drawings. In the following embodiments, a manufacturing system 1 for manufacturing a capacitor electrode 103 by removing a BPSG film 100 that is a silicon oxide film on a surface of a wafer W will be described in detail. Further, in the specification and the accompanying drawings, like reference numerals will be given to like parts having substantially the same functions, and redundant description thereof will be omitted.

The manufacturing system 1 shown in FIG. 1 includes a loading/unloading part 2 for loading/unloading the wafer W to/from the manufacturing system 1; evacuable load-lock chambers 3; reaction apparatuses 4 for transforming the BPSG film 100 on the wafer W into a reaction product by supplying a gas containing a halogen element to the wafer W; heat treatment apparatuses 5 for performing a PHT (post heat treatment) on the wafer W; and a control computer 6 for sending a control instruction to each unit of the manufacturing system 1. The manufacturing system 1 has two reaction apparatuses 4 and two heat treatment apparatuses 5. Wafers W loaded from the loading/unloading part 2 are transferred, in parallel, to the reaction apparatuses 4 via the load-lock chambers 3 and then transferred to the heat treatment apparatuses 5, respectively. Next, the processed wafers W are unloaded to the loading/unloading part 2 via the load-lock chambers 3, respectively.

The loading/unloading part 2 has a transfer mechanism 10 capable of transferring wafers W. The transfer mechanism 10 has at a side portion thereof three carrier mounting tables 11 for mounting thereon carriers C, each capable of accommodating therein a plurality of wafers W. Further, there is installed an orienter 12 for performing a position alignment for the wafer W by rotating the substantially disk-shaped wafer W. The transfer mechanism 10 can transfer wafers W one by one between the three carriers C, the orienter 12 and the two load-lock chambers 3.

Gate valves are disposed between the load-lock chambers 3 and the loading/unloading part 2, and between the load-lock chambers 3 and the heat treatment apparatuses 5. Accordingly, while maintaining inner spaces of the reaction apparatuses 4 and the heat treatment apparatuses 5 at specific pressure levels, the wafers W can be loaded from the loading/unloading part 2 to the reaction apparatuses 4 and the heat treatment apparatuses 5 and also can be unloaded from the reaction apparatuses 4 and the heat treatment apparatuses 5 to the loading/unloading part 2.

Figure 2:
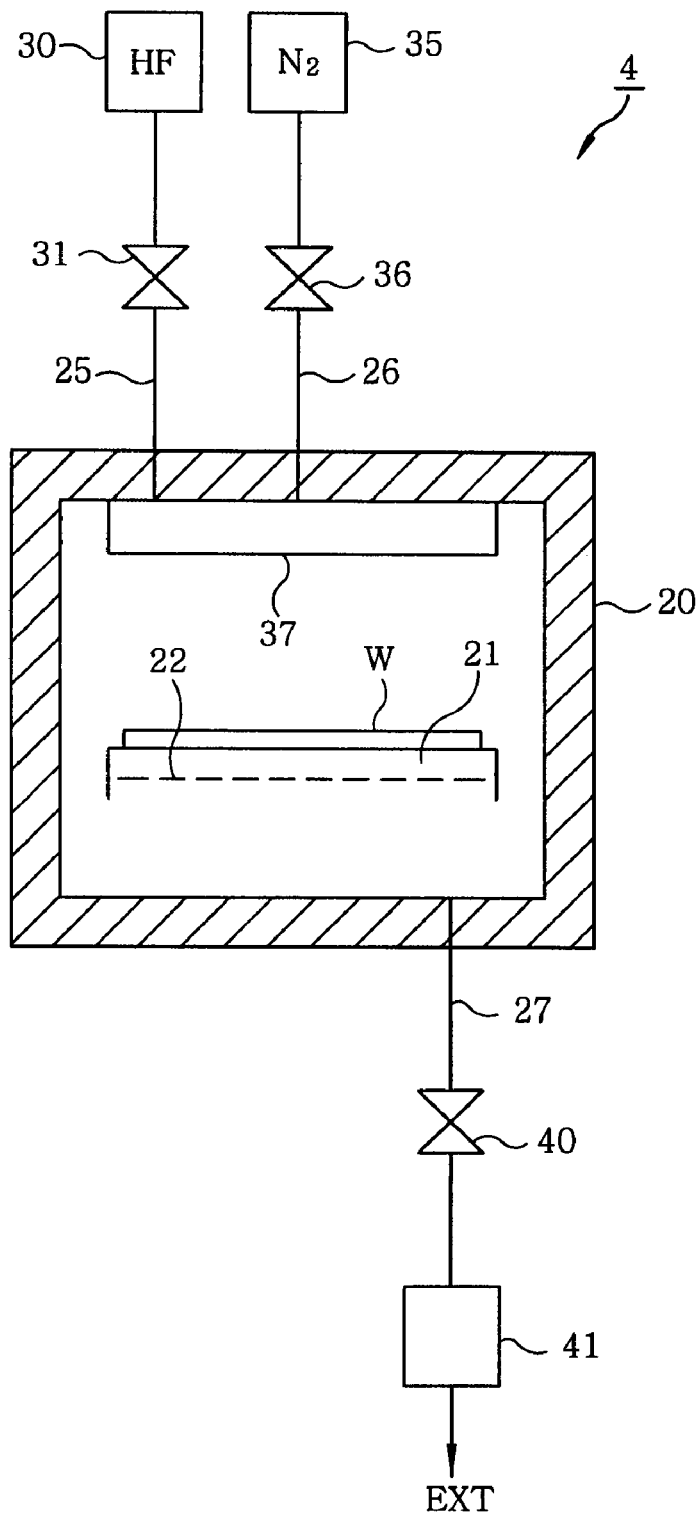
FIG. 2 is a schematic vertical cross sectional view showing a configuration of a reaction apparatus.

As shown in FIG. 2, the reaction apparatus 4 has a reaction chamber 20 of an airtight structure which is capable of accommodating therein a wafer W. The reaction chamber 20 has therein a mounting table 21 for maintaining the wafer W substantially horizontally. Further, the mounting table 21 is provided with a temperature control unit 22 to control temperature of the wafer W to a required level. Although it is not illustrated, a loading/unloading port through which the wafer W is loaded and unloaded between the reaction chamber 20 and the heat treatment apparatus 5 is provided at a side portion of the reaction chamber 20.

In the reaction apparatus 4, the reaction chamber 20 is connected with a supply line 25 for supplying a processing gas containing a halogen element, e.g., hydrogen fluoride gas (HF gas), a supply line 26 for supplying an inert gas serving as a dilution gas, e.g., nitrogen gas ($N_2$ gas), and an exhaust line 27 for exhausting the reaction chamber 20. The supply line 25 is connected with a supply source 30 of HF gas via a flow rate control valve 31 capable of controlling a flow rate of HF gas. The supply line 26 is connected with a supply source 35 of $N_2$ gas via a flow rate control valve 36 capable of controlling a flow rate of $N_2$ gas.

The reaction chamber 20 has on a ceiling portion thereof a shower head 37 for uniformly supplying HF gas and $N_2$ gas respectively supplied via the supply lines 25 and 26 onto the entire surface of the wafer W mounted on the mounting table 21.

The exhaust line 27 has a pressure controller 40 and an exhaust pump 41 for performing a forced exhaust. By operating the exhaust pump 41 and controlling the pressure controller 40, the inner space of the reaction chamber 20 is depressurized to a specific pressure level.

Figure 3:
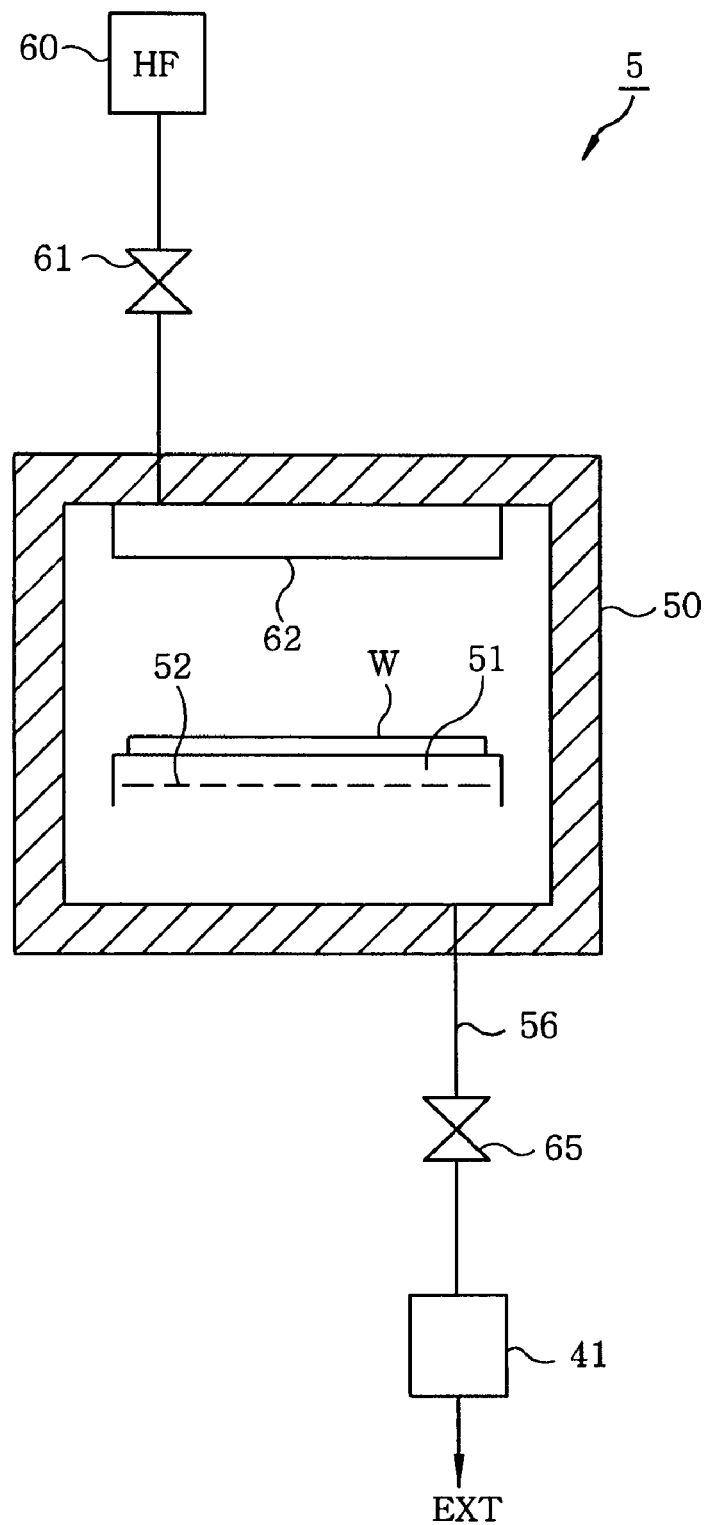
FIG. 3 provides a schematic vertical cross sectional view describing a configuration of a heat treatment apparatus.

As depicted in FIG. 3, the heat treatment apparatus 5 has a heat treatment chamber 50 of an airtight structure which is capable of accommodating therein a wafer W. The heat treatment chamber 50 has therein a mounting table 51 for maintaining the wafer W substantially horizontally. Further, the mounting table 51 is provided with a temperature control unit 52 to control temperature of the wafer W to a required level. Although it is not illustrated, the heat treatment chamber 50 has at side portions thereof a loading/unloading port through which a wafer W is loaded and unloaded to and from the reaction chamber 20 of the reaction apparatus 4 and a loading/unloading port through which a wafer W is loaded and unloaded from and to the load-lock chamber 3.

Moreover, in the heat apparatus 5, the heat treatment chamber 50 is connected with a supply line 55 for supplying an inert gas serving as a dilution gas, e.g., $N_2$ gas or the like and an exhaust line 56 for exhausting the heat treatment chamber 50. The supply line 55 is connected with a supply source 60 of $N_2$ gas via a flow rate control valve 61 capable of controlling a flow rate of $N_2$ gas.

The heat treatment chamber 50 has on a ceiling portion thereof a shower head 62 for uniformly supplying $N_2$ gas supplied via the supply line 55 onto the entire surface of the wafer W mounted on the mounting table 51.

The exhaust line 56 has a pressure controller 65 and an exhaust pump 66 for performing a forced exhaust. By operating the exhaust pump 66 and controlling the pressure controller 65, the inner space of the heat treatment chamber 50 is depressurized to a specific pressure level.

The functional elements of the manufacturing system 1 are connected via respective signal lines with the control computer 6 for automatically controlling an entire operation of the manufacturing system 1. Here, the functional elements means every element for implementing predetermined process conditions, such as the temperature control unit 22 of the reaction chamber 4, the flow rate control valves 31 and 36, the pressure controller 65, the exhaust pump 66, the temperature control unit 52 of the heat treatment apparatus 5, the flow rate control valve 61, the pressure controller 65, and the exhaust pump 66. The control computer 6 is a general purpose computer capable of implementing any function based on execution software.

As illustrated in FIG. 1, the control computer 6 has an operation unit 6a having a CPU (central processing unit), an input/output unit 6b connected with the operation unit 6a, and a storage medium 6c installed in the input/output unit 6b for storing therein control software. The storage medium 6c stores therein the control software (program) that is executed by the control computer 6 to control the manufacturing system 1 to perform a specific substrate processing method to be described later. By executing the corresponding control software, the control computer 6 controls the functional elements of the manufacturing system 1 so that various process conditions (e.g., pressure in the chambers 20 and 50 and the like) defined by a specific process recipe can be implemented.

The storage medium 6c can be either fixedly installed to the control computer 6 or detachably installed to a reader (not shown) provided at the control computer 6 so as to be read by the reader. In a most typical embodiment, the storage medium 6c is a hard disk drive in which control software is installed by a service man of a maker of the manufacturing system 1. In another embodiment, the storage medium 6c is a removable disk, e.g., a CD-ROM or a DVD-ROM, in which control software is written. The removable disk is read by an optical reader (not shown) provided at the control computer 6. Moreover, the storage medium 6c may be any type of a RAM (random access memory) or a ROM (read only memory). Further, the storage medium 6c may be a cassette type ROM. In short, any suitable one known in the field of computer technology can be used as the storage medium 6. Besides, in a factory where a plurality of manufacturing systems 1 are arranged, the control software can be stored in a management computer for generally controlling the control computers 6 of the manufacturing systems 1. In that case, each of the manufacturing systems 1 is controlled by the management computer via communication lines, thereby implementing a specific process.

The following is a description of a method for manufacturing the capacitor electrode 103 by using the manufacturing system 1 in accordance with the embodiment of the present invention which is configured as described above.

Figure 4A:
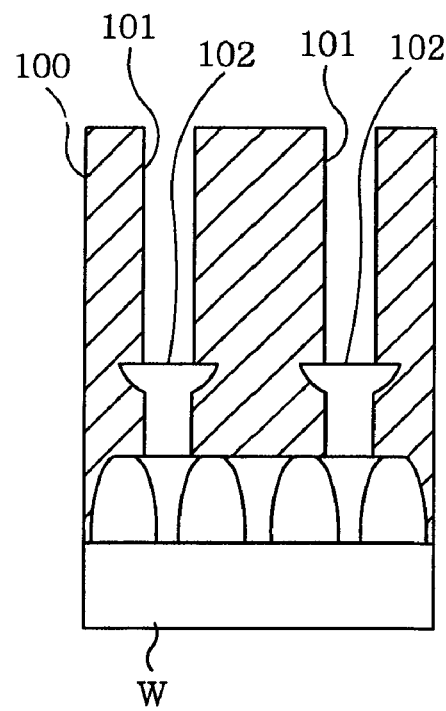
FIG. 4 shows a fragmentary enlarged view of a wafer surface to explain a part of a manufacturing process of a DRAM.

To begin with, a part of a manufacturing process of a DRAM (dynamic random access memory) which is included in the above manufacturing method will be described with reference to FIGS. 4A to 4C. As shown in FIG. 4A, a BPSG (boro-phospho silicated glass) film 100 is formed on a surface of the wafer W, and cylindrical storage node holes 101 having a depth reaching storage nodes 102 on the surface of the wafer W are formed in the BPSG film 100 in a pattern. The storage node holes 101 are obtained by forming the BPSG film 100 on the surface of the wafer W and then performing thereon a photolithography process or the like.

Figure 4B:
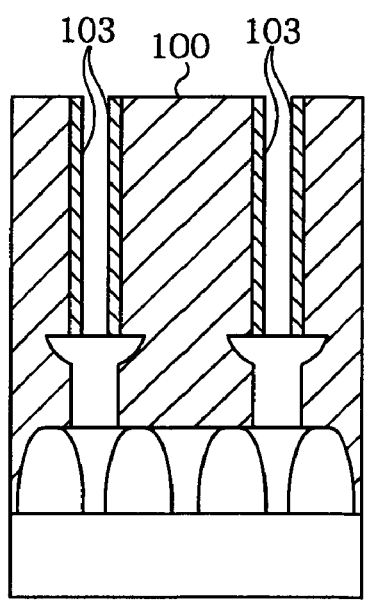
Figure 4C:
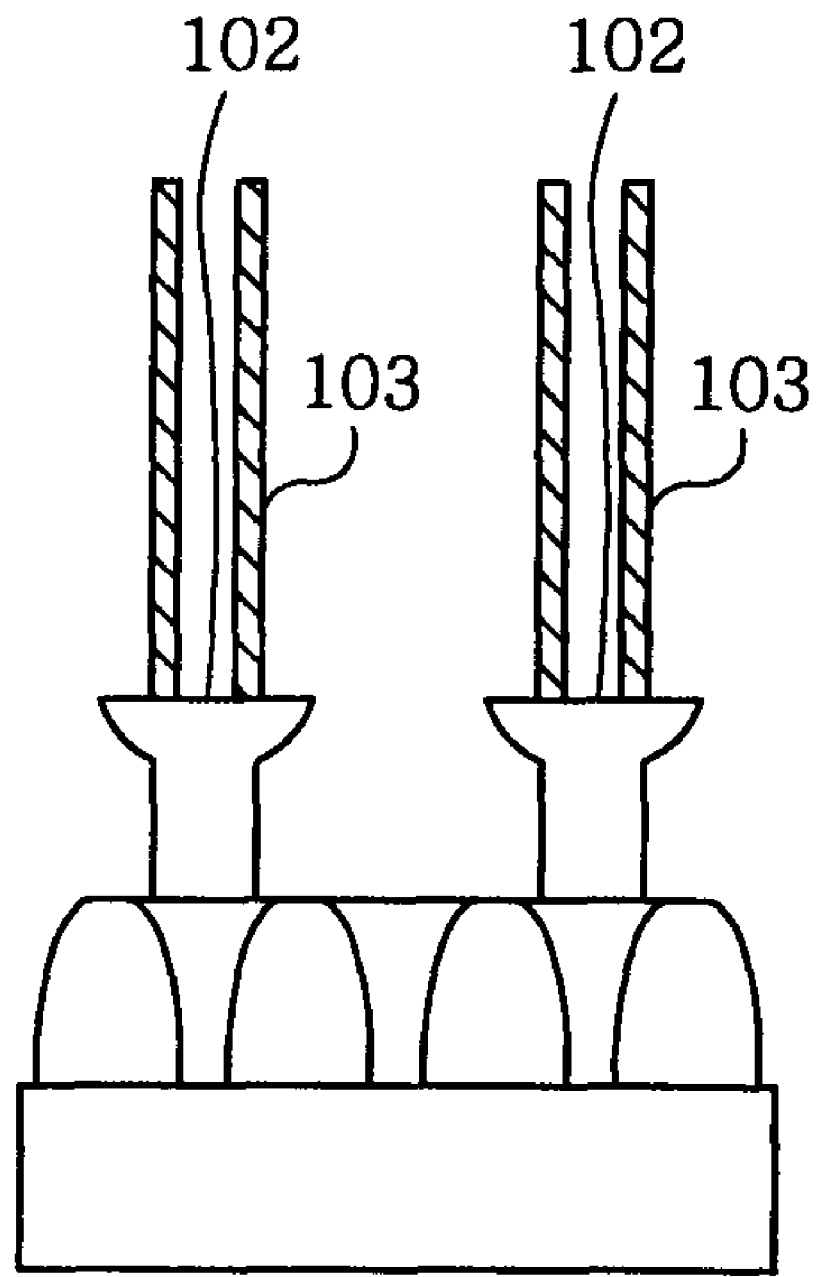

Next, as illustrated in FIG. 4B, a conductive material such as TiN, polysilicon or the like is deposited on inner surface of the storage node holes 101 formed in the BPSG film 100, thereby forming the cylindrical capacitor electrodes 103. Then, the BPSG film 100 remaining around the capacitor electrodes 3 is removed, so that the cylindrical capacitor electrodes 103 corresponding to the storage nodes 102 can be manufactured, as depicted in FIG. 4C. Thereafter, an insulating film with high dielectric constant (so-called "high-k dielectric"), e.g., a transition metal oxide film, a rare earth oxide film or the like, is formed on the surfaces of the capacitor electrodes 103, and capacitor electrodes opposite to capacitor electrodes 103 are formed. In this way, a capacitor, an element of a DRAM, is obtained.

Meanwhile, the manufacturing system 1 in accordance with the embodiment of the present invention performs a process for removing the BPSG film 100 remaining around the capacitor electrodes 103, as a part of the aforementioned series of processes for manufacturing a DRAM. First, the wafer W, in which the cylindrical capacitor electrodes 103 are formed on the inner surfaces of the storage node holes 101 provided in the BPSG film 100 on the surface of the wafer W as shown in FIG. 4B, is accommodated in the carrier C and loaded into the manufacturing system 1.

In the manufacturing system 1, the carrier C having therein a plurality of the wafers W is mounted on the carrier mounting table 11, as shown in FIG. 1. Next, one of the wafers W is taken out of the carrier C and loaded into the load-lock chamber 3 by the wafer transfer mechanism 10. When the wafer W is loaded into the load-lock chamber 3, the load-lock chamber 3 is sealed and depressurized. Then, the load-lock chamber 3 is made to communicate with the previously depressurized reaction chamber 20 of the reaction apparatus 4 and the heat treatment chamber 50 of the heat treating apparatus 5.

Thereafter, the wafer W is loaded into the reaction chamber 20 of the reaction apparatus 4. The wafer W is mounted, with a top surface thereof (semiconductor device forming surface) facing upward, on the mounting table 21 in the reaction chamber 20. Accordingly, the BPSG film 100 on the surface of the wafer W and the capacitor electrodes 103 formed on the inner surfaces of the storage node holes 101 are made to face upward in the reaction chamber 20, as can be seen from FIG. 4B.

When the wafer W is loaded into the reaction chamber 20 of the reaction apparatus 4, the reaction chamber 20 is sealed, and the reaction process is initiated. At this time, the temperature of the wafer W is controlled to a first process temperature by the temperature control unit 22. The first process temperature is lower than or equal to, e.g., about 40° C.

Moreover, air in the inner space of the reaction chamber 20 is forcibly exhausted via the exhaust line 27, so that the pressure in the reaction chamber 20 is depressurized to a specific level. In this case, the pressure in the reaction chamber 20 is set, e.g., between about 400 Pa and about 4000 Pa (between about 3 Torr and about 30 Torr), by operating the exhaust pump 41 and controlling the pressure controller 40.

HF gas and $N_2$ gas are respectively supplied at specific flow rates into the reaction chamber 20 via the supply lines 25 and 26. In this case, the flow rate of HF gas is controlled at, e.g., about 1000 sccm to about 3000 sccm, by the flow rate control valve 31. Further, the flow rate of $N_2$ gas is controlled at, e.g., about 500 sccm to about 3000 sccm, by the flow rate control valve 36. By supplying $N_2$ gas in addition to HF gas serving as reaction gas into the reaction chamber, heat of the temperature control unit 22 installed in the mounting table 21 is effectively transferred to the wafer W. Accordingly, the temperature of the wafer W is precisely controlled.

Since HF gas is supplied under the depressurized atmosphere, the BPSG film 100 remaining around the capacitor electrode 103 on the surface of the wafer W chemically reacts with HF gas. As a result, the BPGS film 100 is transformed into reaction products mainly containing fluorosilicic acid ($H_2SiF_6$).

When the reaction for transforming the BPSG film 100 on the surface of the wafer W into the reaction products mainly containing $H_2SiF_6$ is completed, the flow rate control valve 31 is closed, and the supply of HF gas is stopped. Meanwhile, $N_2$ gas is constantly supplied via the supply line 26, so that the inner space of the reaction chamber 20 is purged by $N_2$ gas. Next, the loading/unloading port of the reaction apparatus 4 is opened, and the reaction chamber 20 of the reaction apparatus 4 communicates with the heat treatment chamber 50 of the heat treatment apparatus 5. Further, the wafer W is transferred from the reaction chamber 20 of the reaction apparatus 4 to the heat treatment chamber 50 of the heat treatment apparatus 5.

Thereafter, the wafer W is mounted, with the top surface thereof facing upward, on the mounting table 51 in the heat treatment apparatus 50. Accordingly, the BPSG film 100 on the surface of the wafer W which is transformed into a reaction product and the capacitor electrodes 103 formed on the inner surfaces of the storage node holes 101 are made to face upward in the heat treatment chamber 50.

When the wafer W is loaded into the heat treatment chamber 50 of the heat treatment apparatus 5, the heat treatment chamber 50 is sealed, and the heat treatment process is initiated. At this time, the temperature of the wafer W is controlled to a second process temperature higher than the first process temperature by the temperature control unit 52. The second process temperature is, e.g., about 100° C. to about 400° C.

Moreover, air in the inner space of the heat treatment chamber 50 is forcibly exhausted via the exhaust line 56, so that a pressure in the heat treatment chamber 50 is depressurized to a specific level. In this case, the pressure in the heat treatment chamber 50 is set, e.g., between about 133 Pa and about 400 Pa (between about 1 Torr and about 3 Torr), by operating the exhaust pump 66 and controlling the pressure controller 65.

Furthermore, $N_2$ gas is supplied at a specific flow rate into the heat treatment chamber 50 via the supply line 55. In this case, the flow rate of $N_2$ gas is controlled at, e.g., about 500 sccm to about 3000 sccm, by the flow rate control valve 61. Accordingly, heat of the temperature control unit 52 installed in the mounting table 51 is effectively transferred to the wafer W and, hence, the temperature of the wafer W is precisely controlled.

A reaction product generated by the above reaction is heated and vaporized to $SiF_4$ gas and HF gas. Therefore, a reaction product remaining around the capacitor electrodes 103 is removed. As a consequence, the BPSG film 100 is removed from the surface of the wafer W, thereby leaving the cylindrical capacitor electrodes 103 corresponding to the storage nodes 102, as illustrated in FIG. 4C.

When the heat treatment is completed, the flow rate control valve 61 is closed, and the supply of $N_2$ gas is stopped. Meanwhile, the loading/unloading port of the heat treatment apparatus 5 is opened. Next, the wafer W is unloaded from the heat treatment chamber 50 and loaded into the load-lock chamber 3. When the wafer W is loaded into the load-lock chamber 3, the load-lock chamber 3 is sealed to the atmospheric pressure and, then, the load-lock chamber 3 communicates with the loading/unloading part 2. Further, the wafer W is unloaded from the load-lock chamber 3 and returned to the carrier C on the carrier mounting table 11 by the transfer mechanism 10, thereby completing a series of processes in the manufacturing system 1.

In accordance with the above processing method, the BPSG film 100 remaining around the capacitor electrodes 103 is transformed into the reaction product mainly containing $H_2SiF_6$ by the reaction, and the reaction product is removed by a so-called dry cleaning process for vaporizing the reaction product to $SiF_4$ gas and HF gas through the post heat treatment. By performing the reaction and the heat treatment, the BPSG film 100 can be removed from the surface of the wafer W while avoiding any leaning caused by the surface tension between the capacitor electrodes 103. Accordingly, it is possible to reliably manufacture the capacitor electrodes 103 for use in a DRAM as a semiconductor device.

While the invention has been shown and described with respect to the embodiments, it will be understood by those skilled in the art that various changes and modification may be made without departing from the scope of the invention.

Figure 5:
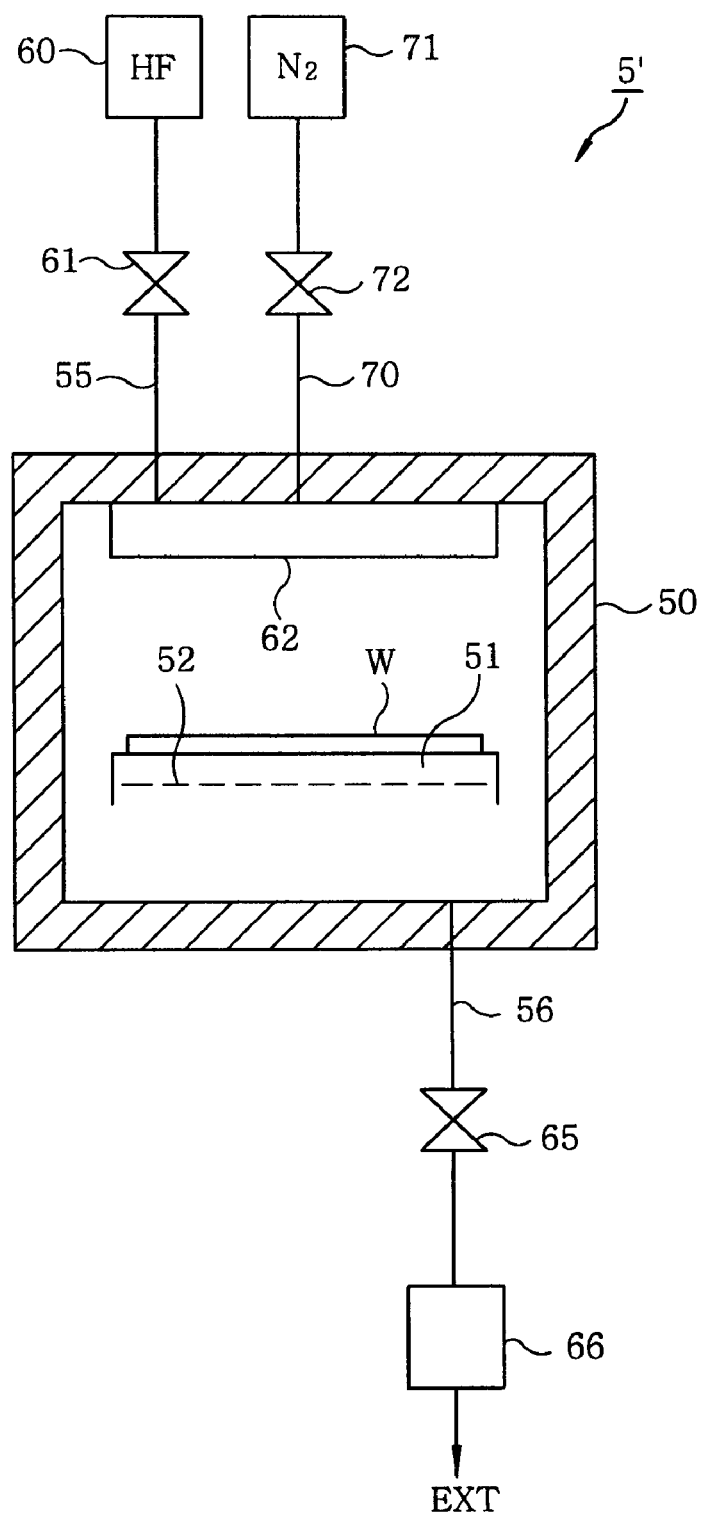
FIG. 5 presents a schematic vertical cross sectional view depicting a configuration of a modified heat treatment apparatus.

For example, although the heat treatment apparatus 5 shown in FIG. 3 has a structure in which only an inert gas is supplied to the heat treatment chamber 50, there can be provided another heat treatment apparatus 5' as shown in FIG. 5. The heat treatment apparatus 5' has a structure in which a supply line 70 for supplying ammonia gas as alkaline gas in addition to the supply line for supplying an inert gas to the heat treatment chamber 50. The supply line 70 is connected with a supply source 71 of ammonia gas, and has a flow rate control valve 72 capable of controlling a flow rate of ammonia gas. The heat treatment apparatus 5' shown in FIG. 5 has the same configuration as that of the heat treatment apparatus 5 shown in FIG. 3 except that the supply line 70 for supplying ammonia gas to the heat treatment chamber 50 is additionally connected thereto.

When the process for removing the BPSG film 100 remaining around the capacitor electrodes 103 is performed by the manufacturing system 1 having the heat treating apparatus 5', the BPSG film 100 remaining around the capacitor electrode 103 on the surface of the wafer W chemically reacts with HF gas in the reaction apparatus 4 and thus is transformed into a reaction product mainly containing $H_2SiF_6$. Then, the wafer W is transferred from the reaction chamber 20 of the reaction apparatus 4 to the heat treatment chamber 50 of the heat treatment apparatus 5'. Further, the BPSG film 100 on the surface of the wafer W which is transformed into the reaction product and the capacitor electrodes 103 formed on the inner surfaces of the storage node holes 101 are made to face upward in the heat treatment chamber 50.

When the wafer W is loaded into the heat treatment apparatus 5', the heat treatment chamber 50 is sealed, and the heat treatment process is initiated. At this time, the temperature of the wafer W is controlled to a second process temperature higher than the first process temperature by the temperature control unit 52. The second process temperature is, e.g., about 100° C. to about 400° C.

Moreover, air in the inner space of the heat treatment chamber 50 is forcibly exhausted via the exhaust line 56, so that the pressure in the heat treatment chamber 50 is depressurized to a specific level. In this case, the pressure in the heat treatment chamber 50 is set, e.g., between about 133 Pa and about 400 Pa (between about 1 Torr and about 3 Torr), by operating the exhaust pump 66 and controlling the pressure controller 65.

Furthermore, $N_2$ gas is supplied at a specific flow rate to the heat treatment chamber 50 via the supply line 55. In this case, the flow rate of $N_2$ gas is controlled at, e.g., about 500 sccm to about 3000 sccm, by the flow rate control valve 61. Therefore, heat of the temperature control unit 52 installed in the mounting table 51 is effectively transferred to the wafer W and, hence, the temperature of the wafer W is precisely controlled.

In this heat treatment apparatus 5', ammonia gas is supplied at a specific flow rate to the heat treatment chamber 50 via the supply line 70. At this time, the flow rate of ammonia gas is controlled at, e.g., about 1000 sccm to about 3000 sccm, by the flow rate control valve 72. By supplying ammonia gas, the BPGS film 100 transformed into the reaction product mainly containing $H_2SiF_6$ further reacts with ammonia and is transformed into a reaction product mainly containing ammonium fluorosilicate $((NH_4)_2SiF_6)$.

The reaction product thus generated is heated and vaporized to $SiF_4$ gas, $NH_3$ gas and HF gas. Accordingly, the reaction product remaining around the capacitor electrodes 103 is removed, thereby leaving on the surface of the wafer W the cylindrical capacitor electrodes 103 corresponding to the storage nodes 102, as shown in FIG. 4C.

When the heat treatment is completed, first of all, the flow rate control valve 72 is closed, and the supply of ammonia gas is stopped. After the purging using $N_2$ gas is completed, the flow rate control valve 61 is closed, and the supply of $N_2$ gas is stopped. Further, the wafer W is unloaded from the load-lock chamber 3 and returned to the carrier C on the carrier mounting table 11, thereby completing a series of processes in the manufacturing system 1.

In accordance with the above treatment method, the BPSG film 100 can be removed from the surface of the wafer W while avoiding any leaning caused by the surface tension between the capacitor electrodes 103. Furthermore, in the heat treatment apparatus 5', $(NH_4)_2SiF_6$ generated by the reaction with ammonia is more easily vaporized than $H_2SiF_6$ and thus is more easily removable.

In the above embodiment, the case of removing the BPSG film on the surface of the wafer W has been described. It is believed that the processing of the present invention is effective in removing the BPSG film due to moisture contained in the BPSG film. In other words, the BPSG film has low density and high moisture content compared with a thermal oxide film, a native oxide film or the like, despite that they are all silicon oxide films. The BPSG film having high moisture content has low activation energy and thus easily reacts with HF, the activation energy being required to generate $H_2SiF_6$ by the reaction with HF.

On the other hand, the thermal oxide film, the native oxide film or the like which has comparatively low moisture content has high activation energy and thus hardly reacts with HF, the activation energy being required to generate $H_2SiF_6$ by the reaction with HF.

According to the above theory, when a target portion made of a BPSG film and a target portion made of a native oxide film are exposed on a surface of a substrate, it is possible to selectively transform the BPSG film having low activation energy into $H_2SiF_6$ by the reaction with HF while avoiding the reaction between the native oxide film and HF. After only the target portion made of the BPSG film is transformed into $H_2SiF_6$, the substrate is thermally treated. Accordingly, the target portion made of the BPSG film transformed into $H_2SiF_6$ is selectively removed from the surface of the substrate, whereas the target portion made of the native oxide film is left on the surface of the substrate.

Moreover, the above theory can be applied not only to the BPSG film but also to a silicon oxide film made of TEOS having high moisture content as in the case of the BPSG film, e.g., a plasma-TEOS film formed by a plasma CVD apparatus and a LP-TEOS film formed by a thermal CVD apparatus, a carbon compound having an SP3 hybrid orbitals same as that of the BPSG film, or the like. Therefore, the present invention can be applied to the removal of the target portion made of the TEOS silicon oxide film, the carbon compound or the like.

In the above embodiment, $N_2$ gas is used as an inert gas supplied as a dilution gas to the reaction chamber 20 of the reaction apparatus 4 and the treatment chamber 50 of the heat treatment apparatus 5. However, there can be used another inert gas, e.g., Ar, He or Xe gas, or a gaseous mixture of at least two of Ar, $N_2$, He and Xe gas. Moreover, the supply of inert gas can be omitted.

Test Example 1

By considering $Si(OH)_4$ as an approximation to a silicon oxide $(SiO_2)$, variation in activation energy Ea needed for the reaction of $Si(OH)_4$ and HF was simulated depending on the presence of water $(H_2O)$. When $H_2O$ does not exist, Ea was 1.04 eV. Meanwhile, when $H_2O$ and HF are present in a molecular ratio of 1:1, Ea was 0.92 eV. Further, when $H_2O$ and HF are present in a molecular ratio of 2:1, Ea was 0.46 eV.

Test Example 2

The dry cleaning (etching) of the present embodiment which includes the chemical reaction and the heat treatment was performed on a BPSG film, a silicon oxide film made of TEOS and a thermal silicon oxide film, all of which are used in manufacturing semiconductor devices. As a result, an etching ratio between the BPSG film, the TEOS silicon oxide film, and the thermal silicon oxide film was about 500:20:0. Especially, a selectivity of the BPSG film to the thermal silicon oxide film was greater than or equal to about 10000.

The present invention can be applied to manufacture of a capacitor electrode in a manufacturing process of a semiconductor device.

While the invention has been shown and described with respect to the embodiments, it will be understood by those skilled in the art that various changes and modification may be made without departing from the scope of the invention as defined in the following claims.

What is claimed is:

1. A method for manufacturing a capacitor electrode comprising:
    forming a silicon oxide film on a surface of a substrate;
    etching a hole in the silicon oxide film,
    depositing metal in the hole in the silicon oxide film to form the capacitor electrode;
    removing the silicon oxide film surrounding the capacitor electrode by,
    transforming the silicon oxide film into a reaction product by supplying a gas containing a halogen element to chemically react with the silicon oxide film while controlling temperature of the substrate to a first process temperature, and
    removing the reaction product while controlling the temperature of the substrate to a second process temperature higher than the first process temperature,
    wherein while removing the reaction product by heating, an alkaline gas is supplied.

2. The method of claim 1, wherein the silicon oxide film is a BPSG film.

3. The method of claim 1, wherein the capacitor electrode has a cylindrical shape.

4. The method of claim 1, wherein the gas containing a halogen element is a gas containing HF.

5. The method of claim 1, wherein the transforming the silicon oxide film to the reaction product is performed under a depressurized atmosphere.

6. The method of claim 1, wherein the removing the reaction product by heating is performed under the depressurized atmosphere.

7. The method of claim 1, wherein the alkaline gas is ammonia gas.

8. The method of claim 1, wherein the reaction product is mainly formed of fluorosilicic acid ($H_2SiF_6$).

* * * * *